United States Patent
Song et al.

(10) Patent No.: US 8,136,068 B2
(45) Date of Patent: Mar. 13, 2012

(54) METHODS, SYSTEMS, AND COMPUTER PROGRAM PRODUCTS FOR IMPLEMENTING COMPACT MANUFACTURING MODELS IN ELECTRONIC DESIGN AUTOMATION

(75) Inventors: Li J. Song, Fremont, CA (US); Srini Doddi, Fremont, CA (US); Emmanuel Drego, Los Gatos, CA (US); Nickhil Jakatdar, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 380 days.

(21) Appl. No.: 12/242,442

(22) Filed: Sep. 30, 2008

(65) Prior Publication Data
US 2010/0083200 A1    Apr. 1, 2010

(51) Int. Cl.
*G06F 17/50* (2006.01)

(52) U.S. Cl. .................................................. 716/110
(58) Field of Classification Search .................. 716/1, 5, 716/100, 110
See application file for complete search history.

(56) References Cited

U.S. PATENT DOCUMENTS

| | | | |
|---|---|---|---|
| 6,298,470 B1 * | 10/2001 | Breiner et al. | 700/109 |
| 7,089,516 B2 | 8/2006 | Arora et al. | |
| 7,218,984 B1 * | 5/2007 | Bayat et al. | 700/121 |
| 7,694,244 B2 * | 4/2010 | Chan et al. | 716/132 |
| 7,792,595 B1 * | 9/2010 | Bomholt et al. | 700/29 |
| 2002/0055193 A1 * | 5/2002 | Tsai | 438/14 |
| 2008/0147374 A1 | 6/2008 | Chan et al. | |
| 2008/0148194 A1 | 6/2008 | Chan et al. | |
| 2008/0148195 A1 | 6/2008 | Chan et al. | |
| 2008/0148216 A1 | 6/2008 | Chan et al. | |
| 2008/0183442 A1 * | 7/2008 | Loo et al. | 703/2 |
| 2009/0005894 A1 * | 1/2009 | Bomholt et al. | 700/97 |
| 2009/0106714 A1 * | 4/2009 | Culp et al. | 716/5 |
| 2009/0228129 A1 * | 9/2009 | Moyne et al. | 700/102 |
| 2010/0121474 A1 * | 5/2010 | Bomholt et al. | 700/104 |

OTHER PUBLICATIONS

Kohaal et al., "Litho(graphy) Aware Device Extraction and Impact on Timing/Power Models," 2007.
Rangarajan et al., Modeling of 65nm & 45nm Manufacturing Effects in Cadence QRC Extractor & Impact on Timing Analysis, 2007.

* cited by examiner

*Primary Examiner* — Suchin Parihar
(74) *Attorney, Agent, or Firm* — Vista IP Law Group, LLP

(57) ABSTRACT

Disclosed are a method, a system, and a computer program product for implementing compact manufacturing model during various stages of electronic circuit designs. In some embodiments, the method or the system receives or identifies physics based data. In some embodiments, the method or the system receives or identifies the physics based data for the corresponding manufacturing process by using the golden manufacturing process model. In some embodiments, the method or the system uses the physics based data to fine tune, modify, or adjust the golden manufacturing process model. In some embodiments, the method or the system invokes the just-right module. In some embodiments, the method or the system implements the compact manufacturing model and the correct-by-design module and provides guidelines for the various stages of the electronic circuit design.

39 Claims, 12 Drawing Sheets

METHODS, SYSTEMS, AND COMPUTER PROGRAM PRODUCTS FOR IMPLEMENTING COMPACT MANUFACTURING MODELS IN ELECTRONIC DESIGN AUTOMATION

BACKGROUND

The invention relates to technology for designing and verifying an integrated circuit ("IC") design.

An IC has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information, for example, of circuit primitives such as transistors and diodes, their sizes and interconnections.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. The test of extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

Common electrical characteristics that are extracted from an integrated circuit layout include capacitance and resistance of the various "nets" (electrical interconnects) in the integrated circuit. These electrical characteristics are sometimes referred to as "parasitic" since these are electrical characteristics are not intended by the designer but result from the underlying physics of the integrated circuit design. For example, when an integrated circuit designer wishes to connect two different locations of an integrated circuit with an electrical conductor, the electrical circuit designer would ideally like perfect conductor with zero resistance and zero capacitance. However, the geometry of a real conductor, its material composition, and its interaction with other nearby circuit elements will create some parasitic resistance and parasitic capacitance. The parasitic resistance and parasitic capacitance affect the operation of the designed integrated circuit. Thus, the effect of the parasitic resistance and parasitic capacitance on the electrical interconnect must be considered.

To test an integrated circuit layout, the integrated circuit designer 'extracts' parasitic resistance and parasitic capacitance from the integrated circuit layout using an extraction application program. Then, the integrated circuit designer analyzes and possibly simulates the integrated circuit using the extracted parasitic resistance and parasitic capacitance information. If the parasitic resistance or parasitic capacitance causes undesired operation of the integrated circuit, then the layout of the integrated circuit must be changed to correct the undesired operation. Furthermore, minimizing the amount of parasitic resistance and parasitic capacitance can optimize the performance of the integrated circuit by reducing power consumption or increasing the operating speed of the integrated circuit.

Copper interconnect has become the mainstream at 130 nm or beyond because of its advantages such as its lower resistivity and power consumption and better resistance to electromigration compared to aluminum. On the other hand, copper interconnect has also brought challenges to manufacturing of integrated circuits because of the effects resulting form the interaction between copper interconnects and the neighboring dielectric materials, especially in the chemical-mechanical polishing (CMP) process. A typical effect of these effects comprises thickness variation due to copper dishing and/or dielectric erosion. The thickness variation presents an even more profound problem in multi-layer designs. In order to compensate for the thickness variations, dummy metal fills have been developed and introduced into electronic circuit designs to ensure that the electronic circuit designs meet the metal density requirement usually imposed by foundries.

With the continual effort to shrink the feature size of electronic circuit designs, various model-based, as opposed to rule-based, approaches have been proposed to minimize or better control the thickness variations. These approaches typically optimizes the design or minimizes the thickness variations by taking into account the topographic profiles of the copper layer including the copper layer by electrochemical plating and copper seed layer by a deposition process, and a barrier layer such as a tantalum or a tantalum-nitride layer. Some model-based approaches may even take one or more of the underlying layers into account to evaluate the cumulative effects of a multi-layer electronic circuit design. These modes-based approaches often give more accurate prediction or estimate of the topography or other attributes of the electronic circuit design. Nonetheless, these model-based approaches almost always involve intensive computation in simulation and thus are usually implemented for the later stages of the electronic circuit design such as the sign-off/design closure stage.

Lithography simulation has recently gathered more attention in the past decades or two because of the increasing cost in manufacturing photomasks and development time to redesign and remanufacture a revised set of photomasks in case of a error in the design of the masks. With the advance of deep submicron technologies, resolution enhancement techniques (RET) have become one of the most important techniques to guarantee design for manufacturability (DFM).

Nonetheless, RET may pose further challenges to the integrated circuit (IC) design due to the continual pursuit for smaller geometry size and the use of shorter wavelength on the lithographic tools such as the 193 nm λ ultra-high numerical aperture (NA) lithography or even the Extreme Ultra Violet lithography, especially in the deep submicron and increasing clock frequency designs. For example, in order to meet the increasing demand for higher resolution and finer geometries, the semiconductor industry has been pushing in order to obtain larger numerical aperture (NA) to achieve smaller minimum feature size. However, larger numerical aperture also decreases the depth of focus, and such decreased depth of focus causes the lithographic tools' ability to print accurate circuits to be more sensitive to the topographical variation of the films on the wafer. This continual push towards smaller feature sizes and higher clock frequencies has made lithographic simulation even more important.

Moreover, for semiconductor manufacturing process nodes of 65 nm and beyond, accurate modeling of variations caused by various semiconductor manufacturing processes (e.g., a chemical-mechanical polishing (CMP), an etch process, or a lithography process) or other aspects of the electronic circuit has become more critical for modern electronic circuit designs in order to, for example, achieve higher yield or improve performance of the electronic circuit designs. As a result, physics-based modeling has been introduced to predict, for example, the thickness and/or topographic variations of each layer caused by one or more manufacturing processes Such as the CMP process. Some of these physics-based models have demonstrated that by using a predicted location and design specific thickness profile, the extraction tool can usually extract more accurate RC values. These physics-based models, although prove to be quite useful at later stages, such as the sigh-off stage, of the electronic circuit design, usually require long simulation time and thus are of limited usefulness for the earlier stages of die electronic circuit designs such as floor planning, place and route, and post route optimization.

Nonetheless, with the continual push for smaller features and high clock frequencies, there is a need for accounting for the variations or other aspects of the electronic circuit designs at the early stages of the electronic circuit design process. Unlike the physics-based models, conventional rule-based approaches produce the results within a shorter period of time, yet the accuracy of such results may not meet the requirements of modern electronic circuit designs. For example, during design stages such as floor planning, place and route, or post route optimization, minimizing design closure time is essential as multiple iterations are usually performed to find a desired solution based upon one or more design metrics such as congestion, timing, power, and chip size, etc. At these early design stages, knowledge of, for example, thickness variation of a particular layer may help circuit designers assess the performance of the circuit more realistically and accurately and thereby select a better floor plans and/or routes.

On the other hand, circuit designers are often presented with additional challenges during the early design stages such as floor planning, place and route, and post route optimization. For example, there may still exist some unknowns of the circuit which are not yet solved for or finalized during these early stages, and the accuracy requirements for the design metrics and/or the manufacturing process modeling may not be the same as those of the later stages such as the sign offstage.

Therefore, there exists a need for a method, system, and computer program product for implementing a compact manufacturing model which accounts for the significant physical effects to afford a circuit designer a sliding scale to find a perfect balance between speed in finding a set of results for the electronic circuit design and accuracy of the design for all stages of the electronic circuit designs including the early stages of the electronic circuit design such as floor planning, place and route, and post route optimization.

SUMMARY

Disclosed are various embodiments of methods, systems, and computer program products for implementing a compact manufacturing model which may be utilized during various stages of an electronic circuit design. Various embodiments of the methods or systems comprise the acts of identifying an electronic circuit design, identifying a manufacturing process which is used to fabricate a portion of the electronic circuit design, identifying physics based data for the manufacturing process, determining or identifying a compact manufacturing model for the manufacturing process based at least in part upon the physics based data, wherein the compact manufacturing model correlates a first characteristic of the electronic circuit on a first domain to a second characteristic of the electronic circuit on a second domains and displaying a result of the act of determining or identifying the compact manufacturing model or storing the result in a computer readable medium.

In some embodiments, the methods or the system for implementing a compact manufacturing model may further comprise the acts of identifying a design stage of the electronic circuit design and determining a just-right requirement for the design stage. In some embodiments, the methods or the system for implementing a compact manufacturing model may further comprise the acts of identifying an input and determining a just-right prediction for the electronic circuit design for the input. In some embodiments, the methods or the system for implementing a compact manufacturing model may further comprise the acts of identifying a potential problem area in the electronic circuit design using the compact manufacturing model. In some embodiments, the methods or the system for implementing a compact manufacturing model may further comprise the acts of determining a guard-band for an input using the compact manufacturing model. In some embodiments, the methods or the system for implementing a compact manufacturing model may further comprise the acts of implementing the virtual change as an engineering change order. In some embodiments, the methods or the system for implementing a compact manufacturing model may be utilized in various stages of electronic circuit design, wherein the various stages of electronic circuit design comprise floor-planning, placement, routing, post-routing optimization, synthesis, verification, simulation, timing analysis, power analysis, design for manufacturability (DFM), closure, or mask data preparation.

BRIEF DESCRIPTION OF THE FIGURES

The drawings illustrate the design and utility of preferred embodiments of the present invention. It should be noted that the figures are not drawn to scale and that elements of similar strictures or functions are represented by like reference numerals throughout the Figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention which are directed to an improved method, system, and computer program product for implementing a process for chemical mechanical polishing (CMP) simulation. The process further comprises an act of online evaluation of the layout for the electronic circuit design of interest. The act of online evaluation comprises recognizing one or more known photolithographic mask patterns in a layout and evaluating the corresponding model. Other and additional objects, features, and advantages of the invention are described in the detailed description, figures, and claims.

Figure 1:
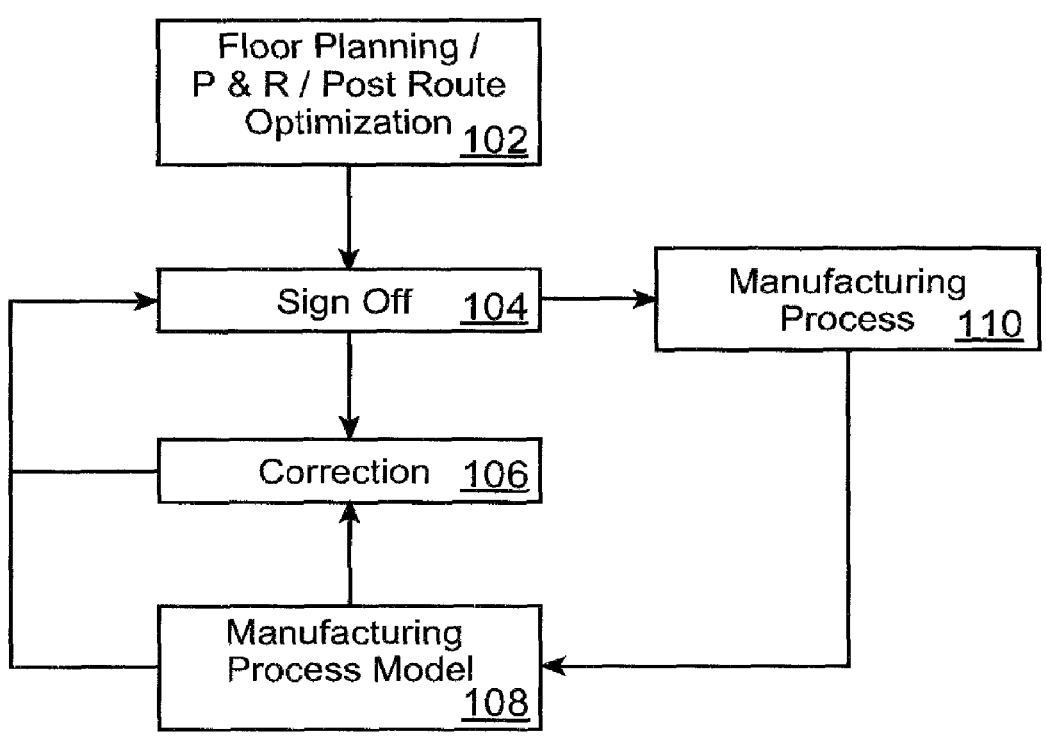
FIG. 1 illustrates a process for designing electronic circuits while accounting for the manufacturing variations.

FIG. 1 depicts a high level diagram of a system or a process for a typical process for designing or implementing an electronic circuit design using a model-based or a rule-based manufacturing process model to account for manufacturing process variations during a sign-off stage of the electronic circuit design. At 102, the electronic circuit design is identified and received after the completion of, for example, the floor planning, place and route, or the post-rule optimization stage. At 104, the method or the system for accounting for manufacturing process variations receives the electronic circuit design from 102 for sign-off.

After the sign-off at 104, the method or the system for accounting for manufacturing process variations may pass the design to 106 for correction of the electronic circuit designs in some embodiments or to 110 to the respective manufacturing process in some other embodiments. At 110, one or more test wafers or patterned wafers may be manufactured by the respective manufacturing process according to the electronic circuit design after sign-off at 104.

The method or the system for accounting for manufacturing process variations may then pass the results of the one or more test wafers or patterned wafers to 108 where the method or the system for accounting for manufacturing process variations employs a manufacturing process model which predicts or estimates the printed image of the electronic circuit design which is based upon and/or calibrated by the results of the test or patterned wafers from 110. The method or the system for accounting for manufacturing process variations may then pass the results of the manufacturing process model 108 to 106 for correction, adjustments, or fine tuning of the electronic Circuit design. In these approaches, the manufacturing process model may be model-based, rule-based, or a combination of the two.

On the one hand, the model-based approach usually gives better accuracy and prediction of the manufacturing effects but is usually much slower and requires much more computation resources. On the other hand, the rule-based approaches usually take less time in finding the solution yet their accuracy may be questionable. More importantly, these approaches are usually based upon or calibrated by results of one or more test wafers or patterned wafers, and therefore each correction to the design requires an actual manufacturing process calibration or change which takes days or even weeks to accomplish. As such, these approaches are inappropriate for design tasks which require fast turn around time and/or real-time feedback such as hotspot fixing and design for manufacturing optimization.

Various embodiments are generally directed to a method, system, and computer program product for implementing a compact manufacturing model in the electronic circuit design flow. In various embodiments, the compact manufacturing model provides circuit designers a sliding scale to find a perfect balance between speed and accuracy of the results without requiring calibration. In various embodiments, the act of implementing a compact manufacturing model in the electronic circuit design flow uses statistically sufficient amount of data which are obtained or derived from physics behind a manufacturing process to calibrate each compact manufacturing process without requiring calibration of the actual manufacturing process. That is, in some embodiments, the method or system for implementing a compact manufacturing model in the electronic circuit design flow requires no data from one or more test wafers or patterned wafers for calibration of the rule-based or model-based manufacturing process models. Such calibration or changes are usually expensive and time consuming.

In some embodiments, the method or system for implementing a compact manufacturing model in the electronic circuit design flow receives the data from a golden manufacturing model simulation results for such calibration, changes, or modifications of the compact manufacturing model, where the golden manufacturing model represents the model for a manufacturing process and uses mathematical language to describe the essential aspects of and thus simulate the physics of the manufacturing process. That is, the golden manufacturing model represents knowledge of the manufacturing process that is usable for the electronic circuit design flow.

In addition or in the alternative, the golden manufacturing model represents a descriptive model of the manufacturing process as a hypothesis of how the manufacturing process could work and simulates how an unknown or unforeseen event affects the manufacturing process. In various embodiments, the golden manufacturing model describes the manufacturing process by a set of scalar, vector, and/or tensor variables and a set of mathematical and/or empirical equations which establish one or more relationships between the set of variables. In various embodiments, the method or system for implementing a compact manufacturing model in the electronic circuit design flow receives the data from the golden manufacturing model to train and establish one or more correlations or relationships between the compact manufacturing model and the actual manufacturing process.

In other embodiments, the method or system for implementing a compact manufacturing model in the electronic circuit design flow receives the data, in addition or in the alternative of the data from a golden manufacturing model, from the actual manufacturing results from, for example, foundries and uses such data to train and establish one or more correlations or relationships between the compact manufacturing model and the actual manufacturing process. In these embodiments, unlike some conventional approaches which use manufacturing results to merely calibrate the manufacturing process models, the method or system for implementing a compact manufacturing model in the electronic circuit design flow receives statistically sufficient amount of data to train the compact manufacturing model for a manufacturing, process and to establish one or more relationships or correlations between the compact manufacturing model and the actual manufacturing process.

In some embodiments, the method or system for implementing a compact manufacturing model in the electronic circuit design flow uses such data to train and establish correlations and/or relationships between the compact manufacturing model and the actual manufacturing process by using processes employing artificial intelligence processes or neural network processes.

Various embodiments have demonstrated that such training and establishment needs to be done once for a manufacturing process and may be completed within one or a few hours while maintaining better than 90 percent of correlations and relationships between the compact manufacturing model and the actual manufacturing process as opposed to days or even weeks which are usually required to iteratively modify the design to obtain desired results on silicon by using test wafers or patterned wafers. Therefore, in various embodiments, the method or system for implementing a compact manufacturing model in the electronic circuit design flow uses a compact manufacturing model to predict results of the corresponding manufacturing process with a fast turn-around time while maintaining sufficient accuracy so the method or system for implementing a compact manufacturing model in the electronic circuit design flow may be used in all stages of the electronic circuit design flow, including the early design stages such as floor planning, place and route, or post-route optimization which usually requires fast turn around time and/or real-time feedback.

Figure 2:
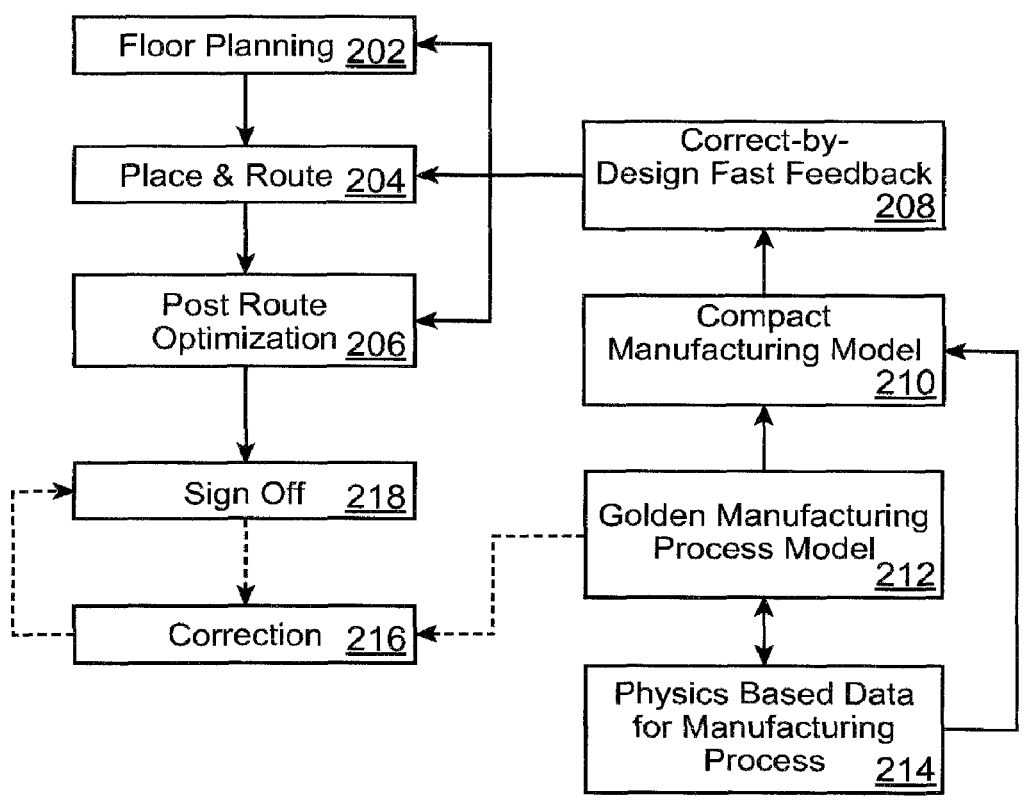
FIG. 2 illustrates the top level diagram of the method or system for implementing a compact manufacturing model in the electronic circuit design flow in some embodiments.

Referring to FIG. 2 which illustrates the top level diagram of the method or system for implementing a compact manufacturing model in the electronic circuit design flow in some embodiments. At 202, 204, and 206, the method or system for implementing a compact manufacturing model in the electronic circuit design now performs the early stage design tasks including floor planning, 202, place and route, 204, and post route optimization, 206, in some embodiments.

At 218, the method or system for implementing a compact manufacturing model in the electronic circuit design flow sends the electronic circuit design to 218 for sign-off. In various embodiments, the method or system for implementing a compact manufacturing model in the electronic circuit design flow receives or identifies physics based data in some embodiments at 214. In some embodiments, the method or system for implementing a compact manufacturing model in the electronic circuit design flow generates the physics based data for the corresponding manufacturing process identified or obtained at 214 by using the golden manufacturing process mode 212.

In some embodiments, the method or system for implementing a compact manufacturing model in the electronic circuit design flow sends the physics based data for the corresponding manufacturing process identified or obtained at 214 to the golden manufacturing process model, 212, to fine tune, modify, or adjust the golden manufacturing process model. In some embodiments, the method or system for implementing a compact manufacturing model in the electronic circuit design flow receives or identifies the physics based data from a manufacturing process which fabricates at least a portion of the electronic circuit according to the electronic circuit design at 214.

In some other embodiments, the method or system for implementing a compact manufacturing model in the electronic circuit design flow receives or identifies the physics based data from a golden manufacturing, process model at 214. At 212, the method or system for implementing a compact manufacturing model in the electronic circuit design flow sends the physics based data to the compact manufacturing model for the corresponding manufacturing process to train the compact manufacturing model and/or to establish one or more correlations or relationships between the compact manufacturing model and the corresponding manufacturing process at 210 in some embodiments. At 208, the method or system for implementing a compact manufacturing model in the electronic circuit design flow performs the correct-by-design fast feedback process in some embodiments.

Figure 3A:
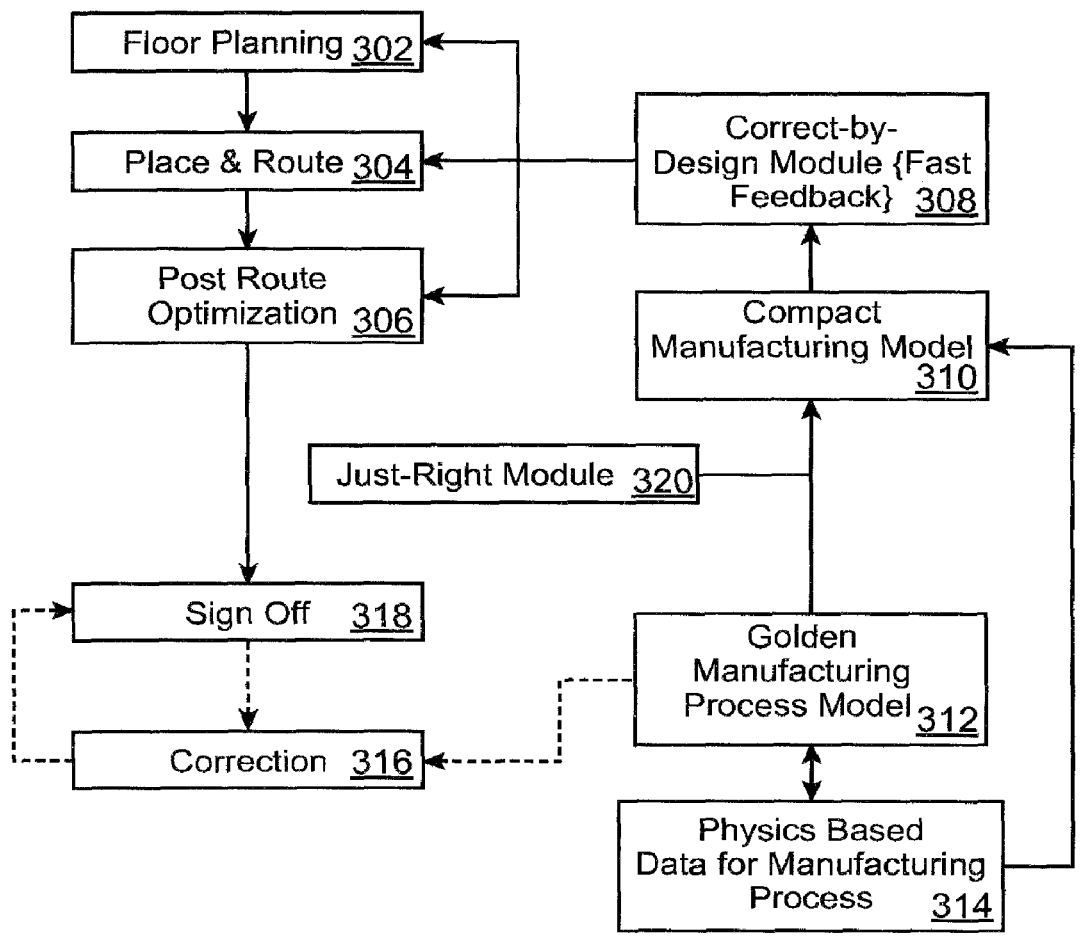
FIG. 3A illustrates the method or system for implementing a compact manufacturing model in the electronic circuit design flow in some embodiments.

Referring to FIG. 3A which illustrates the method or system for implementing a compact manufacturing model in the electronic circuit design now in some embodiments. At 302, 304, and 306, the method or system for implementing a compact manufacturing model in the electronic circuit design flow performs one or more early stage design tasks comprising floor planning, 302, place and route, 304, and post route optimization, 306, in some embodiments.

At 318, the method or system for implementing a compact manufacturing model in the electronic circuit design flow sends the electronic circuit design to 318 for sign-off. In various embodiments, the method or system for implementing a compact manufacturing model in the electronic circuit design flow receives or identifies physics based data in some embodiments at 314. In some embodiments, the method or system for implementing a compact manufacturing model in the electronic circuit design flow receives or identifies the physics based data for the corresponding manufacturing process identified or obtained at 314 by using the golden manufacturing process mode 312.

In some embodiments, the method or system for implementing a compact manufacturing model in the electronic circuit design flow sends the physics based data for the corresponding manufacturing process identified or obtained at 314 to the golden manufacturing process model, 312, to fine tune, modify, or adjust the golden manufacturing process model. In some embodiments, the method or system for implementing a compact manufacturing model in the electronic circuit design flow receives or identifies the physics based data from a manufacturing process which fabricates at least a portion of the electronic circuit according to the electronic circuit design at 314. In some other embodiments, the method or system for implementing a compact manufacturing model in the electronic circuit design flow receives or identifies the physics based data from a golden manufacturing process model, 312, at 314.

At 312, the method or system for implementing a compact manufacturing model in the electronic circuit design flow sends the physics based data to the compact manufacturing model for the corresponding manufacturing process to train the compact manufacturing model and/or to establish one or more correlations or relationships between the compact manufacturing model and the corresponding manufacturing process at 310 in some embodiments.

In some embodiments, the method or system for implementing a compact manufacturing model in the electronic circuit design flow employs the just-right module, which will be described in great details in subsequent paragraphs, to process the physics based data before the method or system for implementing a compact manufacturing model in the electronic circuit design flow sends the physics based data to the compact manufacturing model at 310. At 308, the method or system for implementing a compact manufacturing model in the electronic circuit design flow performs the correct-by-design fast feedback process in some embodiments.

Figure 3B:
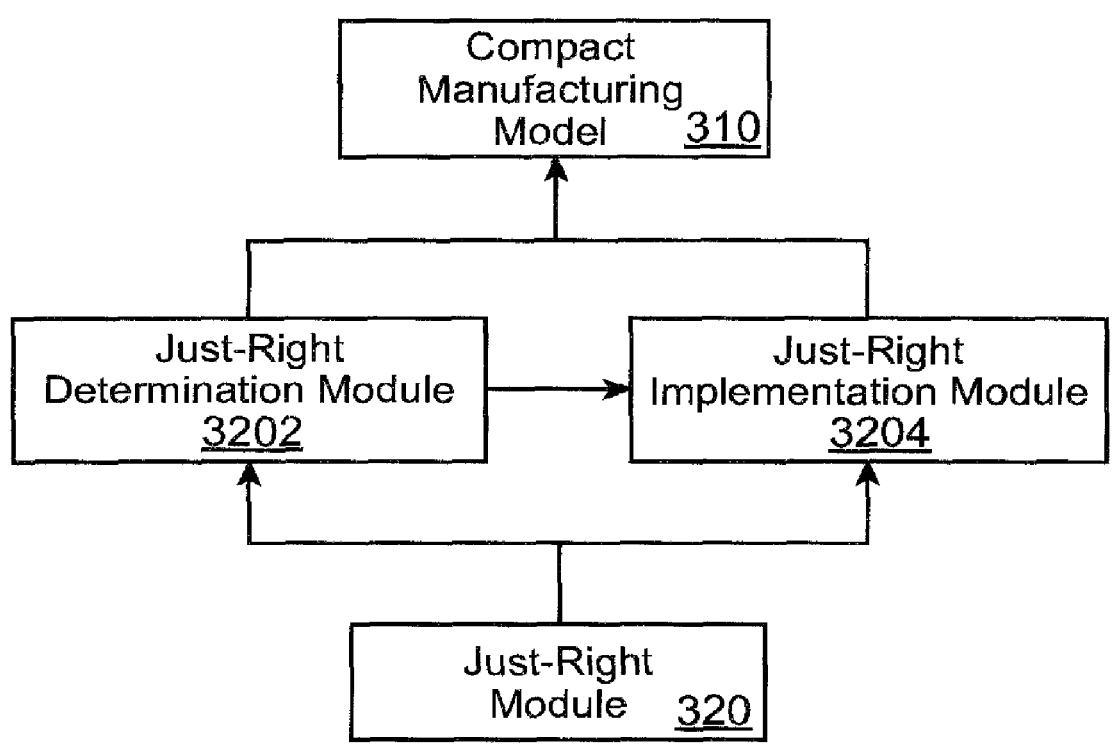
FIG. 3B illustrates more details about the just-right module of the method or system for implementing a compact manufacturing model in the electronic circuit design flow in some embodiments.

Referring to FIG. 3B which illustrates more details about the just-right module 320 employed by the method or system for implementing a compact manufacturing model in the electronic circuit design flow in some embodiments. In some embodiments, the just-right module comprises a just-right determination module 3202 and/or the just-right implementation module 3204. The just-right determination module and the just-right implementation module will be described in great details in subsequent paragraphs.

In some embodiments, the method or system for implementing a compact manufacturing model in the electronic circuit design flow calls the just-right determination module at 3202 and forwards the determination or results of the just-right determination module to the just-right implementation module at 3204 where the just-right implementation module performs its intended functions and sends the results to the compact manufacturing model at 310. In some other embodiments, the method or system for implementing a compact manufacturing model in the electronic circuit design flow calls the just-right determination module to perform one or more of its intended functions and forwards the results directly to the compact manufacturing model at 310.

Figure 3C:
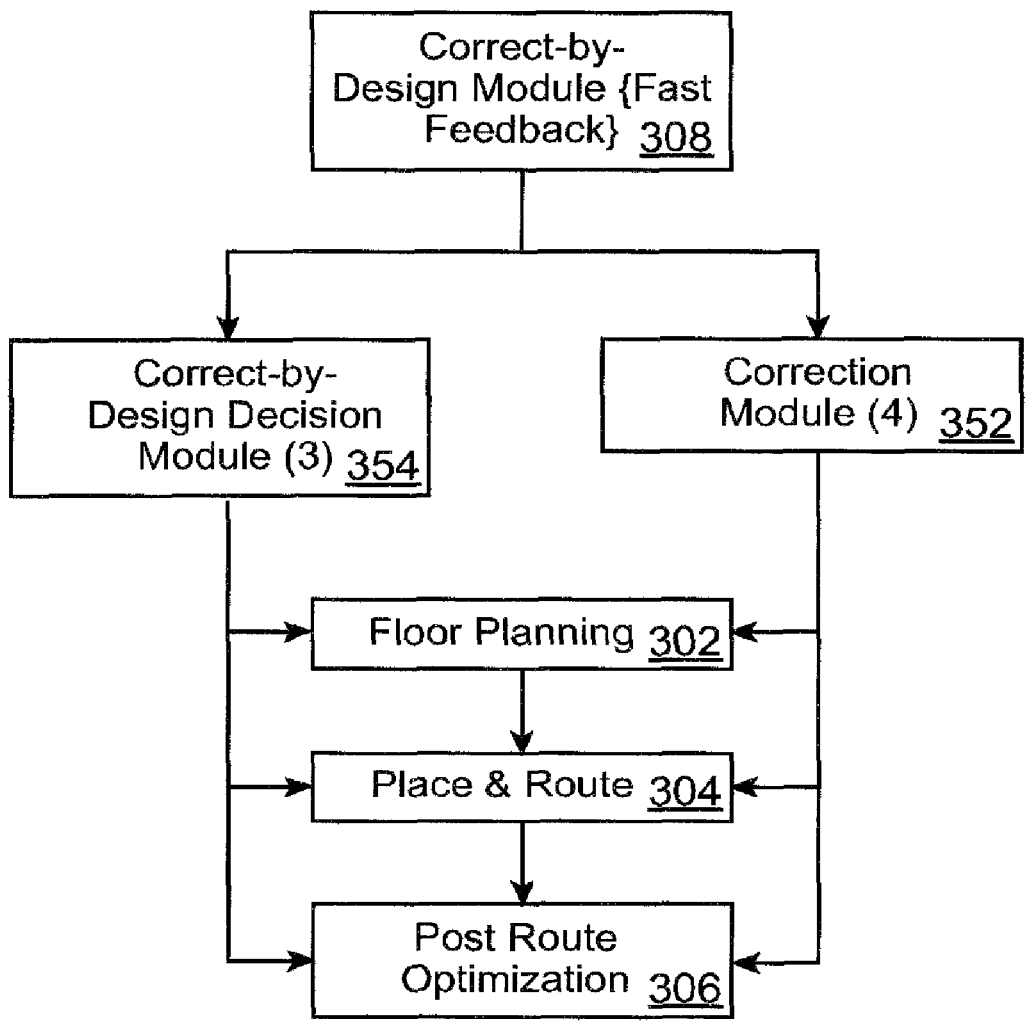
FIG. 3C illustrates more details about the correct-by-design fast feedback module in some embodiments.

Referring to FIG. 3C which illustrates more details about the correct-by-design fast feedback module 308 in some embodiments. In some embodiments, the correct-by-design fast feedback module as shown at 308 comprises the correct-by design decision module 354, and the method or system for implementing a compact manufacturing model in the electronic circuit design flow calls the correct-by-design decision module to perform its intended functions at 354 and sends the results to floor planning, 302, place and route 304, post route optimization, 306, and/or other electronic circuit design tasks.

In some embodiments, the correct-by-design fast feedback module as shown at 308 comprises the correction module 352, and the method or system for implementing a compact manufacturing model in the electronic circuit design flow calls the correction module to perform its intended functions at 354 and sends its results to floor planning, 302, place and route 304, post route optimization, 306, and/or other electronic circuit design tasks.

Figure 4A:
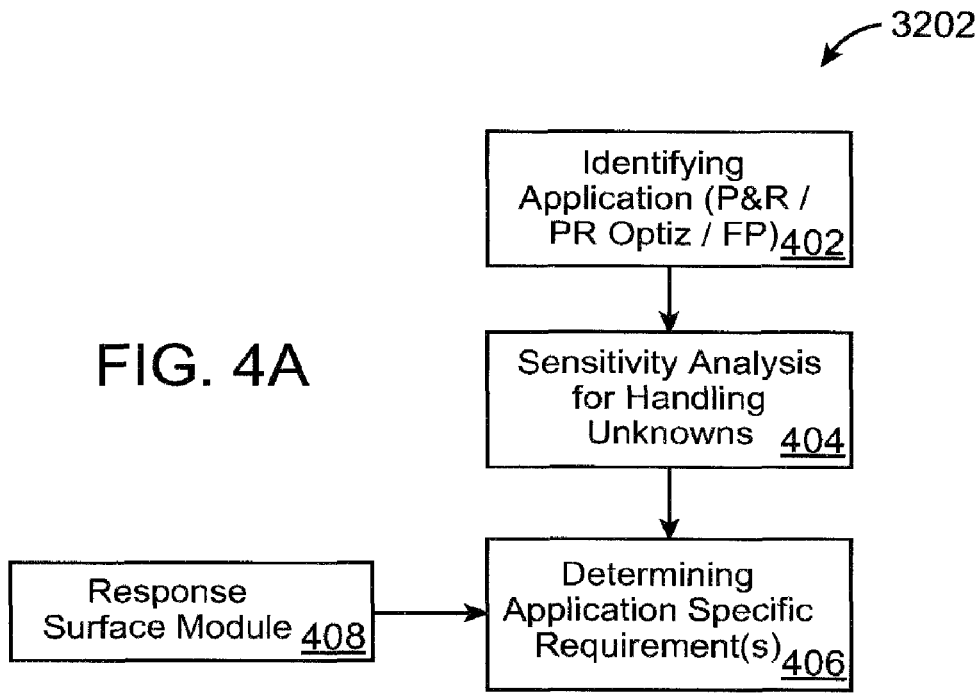
FIG. 4A illustrates more details about the just-right determination module.

Referring to FIG. 4A which illustrates more details about the just-right determination module at 3202. At 402, the method or system for implementing a compact manufacturing model in the electronic circuit design flow identifies an application of interest in some embodiments. In some embodiments, the application comprises one or more design tasks for a particular stage of the electronic circuit design flow. In one embodiment, the particular stage of the electronic circuit design flow comprises floor planning. In another embodiment, the particular stage of the electronic circuit design now comprises place and route. In another embodiment, the particular stage of the electronic circuit design flow comprises post route optimization. At 404, the method or system for implementing a compact manufacturing model in the electronic circuit design flow performs sensitivity analysis for handling unknowns based upon the application of interest identified at 402 in some embodiments.

In some embodiments, the method or system for implementing a compact manufacturing model in the electronic circuit design flow performs sensitivity analysis to determine or identify how the variation or uncertainty in the output of a system may be either qualitatively or quantitatively apportioned to different sources or causes of variations in the input of the system.

In some embodiments, the sources or causes of variations comprise one or more electrical, physical, or thermal characteristics of the electronic circuit design. For example, such sources or causes of variations may be the thickness, the capacitance, or the resistance of a feature of the electronic circuit design. In addition or in the alternative, the method or system for implementing a compact manufacturing model in the electronic circuit design now determines an absolute or a relative weight for each of the sources or causes of variations in view of the variation in the output based upon the application identified at 402 in some embodiments. Based upon the weight for each of the sources or causes of variations, the method or system for implementing a compact manufacturing model in the electronic circuit design flow may then determine the degree of accuracy for the estimation of the source or cause in some embodiments.

In addition or in the alternative, the method or system for implementing a compact manufacturing model in the electronic circuit design now also determines the critically for each of the sources or causes and determines the degree of accuracy for the estimation of the source or cause in some embodiments. For example, the method or system for implementing a compact manufacturing model in the electronic circuit design flow may determine that the thickness of the first group of conductors is more critical and requires more accurate estimation, and that the width of the same group is less critical and thus a less stringent requirement may suffice.

In addition or in the alternative, the method or system for implementing a compact manufacturing model in the electronic circuit design flow determines the strength and/or relevance of each of the sources or causes of the variations or the system in some embodiments. Moreover, in some embodiments, the method or system for implementing a compact manufacturing model in the electronic circuit design flow performs a sampling-based sensitivity analysis where the model is executed repeatedly for one or more combinations of values of the sources or causes of variations or of the values of the inputs of the model.

In some other embodiments, the method or system for implementing a compact manufacturing model in the electronic circuit design flow executes the model repeatedly for one or more combinations of the values of the sources or causes of variations or of the values of the inputs of the model sampled with a probability distribution such as a probability density function. In addition or in the alternative, the method or system for implementing a compact manufacturing model in the electronic circuit design now may also determine the overall uncertainty in the output of the system.

At 406, the method or system for implementing a compact manufacturing model in the electronic circuit design flow determines one or more application specific requirements based upon a result of the sensitivity analysis t 404 in some embodiments. At 408, the method or system for implementing a compact manufacturing model in the electronic circuit design flow invokes the response surface module to perform its intended Functions in some embodiments. In some embodiments, the method or system for implementing a compact manufacturing model in the electronic circuit design flow invokes the response surface module to establish one or more correlations or relationships between a characteristic of a first domain and the a second characteristic of a second domain.

In some embodiments, the method or system for implementing a compact manufacturing model in the electronic circuit design flow may invoke the response surface module to establish one or more relationships or correlations between an input and an output. In some embodiments, the method or system for implementing a compact manufacturing model in the electronic circuit design flow may also call the response surface module to establish one or more correlations or relationships between the variations in the thickness of one or more features of an electronic circuit design in the physical or design metrics domain and the yield in the performance domain. For example, the method or system for implementing a compact manufacturing model in the electronic circuit design flow may invoke the response surface module to better evaluate the impact of issues such as copper pooling, excessive thickness or topography variation, and timing closure when thickness variation is taken into consideration.

In various embodiments, the response surface methodology explores the relationships or correlations between one or more explanatory variables (independent variables, predictor variables, regressors, controlled variables, manipulated variables, or input variables), and one or more response variables (dependent variables, regressands, measured variables, measured variables, responding variables, explained variables, outcome variables, experimental variables, or output variables.)

The explanatory variables (independent variables) are those that are deliberately manipulated to invoke a change in the response variables (dependent variables.) The response variables (dependent variables) are those that are observed to change in response to the independent variables, the method or system for implementing a compact manufacturing model in the electronic circuit design flow may implement the response surface module using a first-order polynomial model in some embodiments.

In some embodiments, the method or system for implementing a compact manufacturing model in the electronic circuit design flow uses the factorial experimental or a fractional factorial design to implement the first-order polynomial model. In some other embodiments where the design under analysis is more complicated, the method or system for implementing a compact manufacturing model in the electronic circuit design flow may use the central composite design to implement the response surface module with a second-order polynomial model.

In some embodiments, the method or system for implementing a compact manufacturing model in the electronic circuit design flow may further use the second-order polynomial model to optimize a response. In various embodiments, the term "optimize" may refer to "maximize", "minimize", "or "attain one or more specific targets."

In some embodiments, the method or system for implementing a compact manufacturing model in the electronic circuit design flow may further utilize similar processes to determine a multiple-response model in which the multiple-response model finds the relationships or correlations between one or more input variables (e.g., thickness) and a plurality of related or unrelated (or dependent or independent) responses (e.g., yield and RC.)

In some embodiments, the method or system for implementing a compact manufacturing model in the electronic circuit design flow analyzes the factorial experiment or a fractional factorial experiment using a regression analysis. In some embodiments where there are only two explanatory variables, the method or system for implementing a compact manufacturing model in the electronic circuit design flow assumes that their effects are linear.

In some embodiments where a quadratic or higher order effect is expected for an explanatory variable, the method or system for implementing a compact manufacturing model in the electronic circuit design flow adopts a more complicated experiment which comprises a central composite design. In some experiments where there is a plurality of explanatory variables whose combinations in the factorial experiment are likely to take a long time due to the numerosity of the combinations, the method or system for implementing a compact manufacturing model in the electronic circuit design flow may implement the response surface module by using a fractional factorial design in which the method or the system considers a subset or a fraction of the full factorial design to explore information about the more important features of the problems studied.

In some embodiments where the method or system for implementing a compact manufacturing model in the electronic circuit design flow adopts a central composite design to implement the response surface module, the method or the system implements a quadratic model for the one or more response variables without having to use a complete three-level factorial experiment.

Figure 4B:
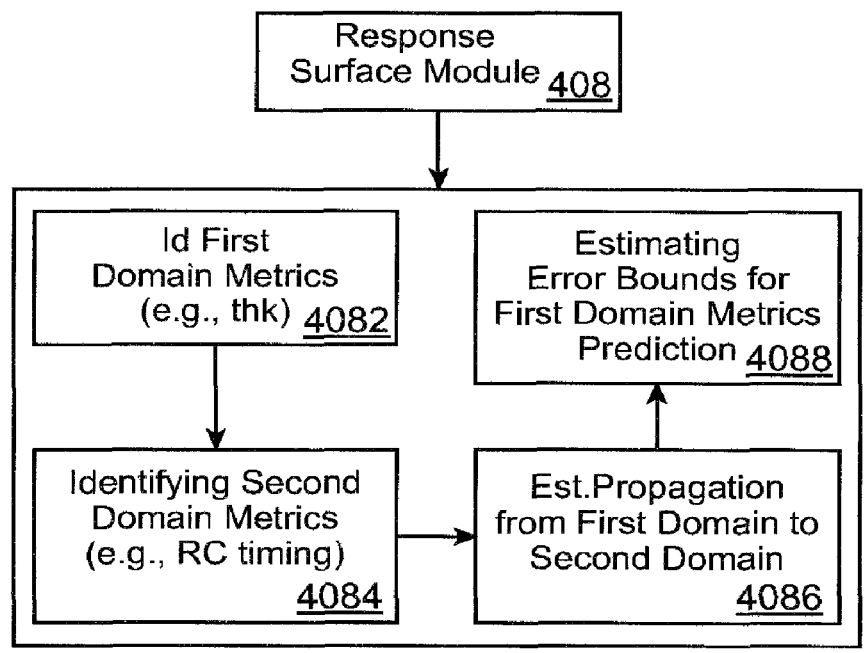
FIG. 4B illustrates more details about the response surface module.

Referring to FIG. 4B which illustrates more details about the response surface module at 408. At 4082, the method or system for implementing a compact manufacturing model in the electronic circuit design flow identifies one or more metrics in a first domain in some embodiments. For example, the method or system for implementing a compact manufacturing model in the electronic circuit design flow may identify the thicknesses the first metric in the design metrics domain or physical domain at 4082 in some embodiments.

At 4084, the method or system for implementing a compact manufacturing model in the electronic circuit design flow identifies one or more metrics in a second domain. For example, the method or system for implementing a compact manufacturing model in the electronic circuit design flow may identify RC timing as the corresponding metric in the performance domain at 4084 in some embodiments.

At 4086, the method or system for implementing a compact manufacturing model in the electronic circuit design flow estimates the propagation from the first domain to the second domain in some embodiments. In some embodiments, the method or system for implementing a compact manufacturing model in the electronic circuit design flow establishes a translation between the first domain and the second domain.

For example, In some embodiments, the method or system for implementing a compact manufacturing model in the electronic circuit design flow may establish a response and/ or a translation between the physical domain parameters (e.g., thickness) and the design metrics domain (e.g., RC, timing) in some embodiments.

At 4088, the method or system for implementing a compact manufacturing model in the electronic circuit design flow estimates the respective error bounds for the predictions of the one or more metrics in the first domain. For example, the method or system for implementing a compact manufacturing model in the electronic circuit design flow may invoke the response surface module to establish a response surface which correlates the variations in the physical domain (e.g., thickness variations) to the timing or RC in the design metrics domain and thereby establishes a realistic error bound or guard-band for the physical domain in light of metrics for the design metrics domain.

Figure 5A:
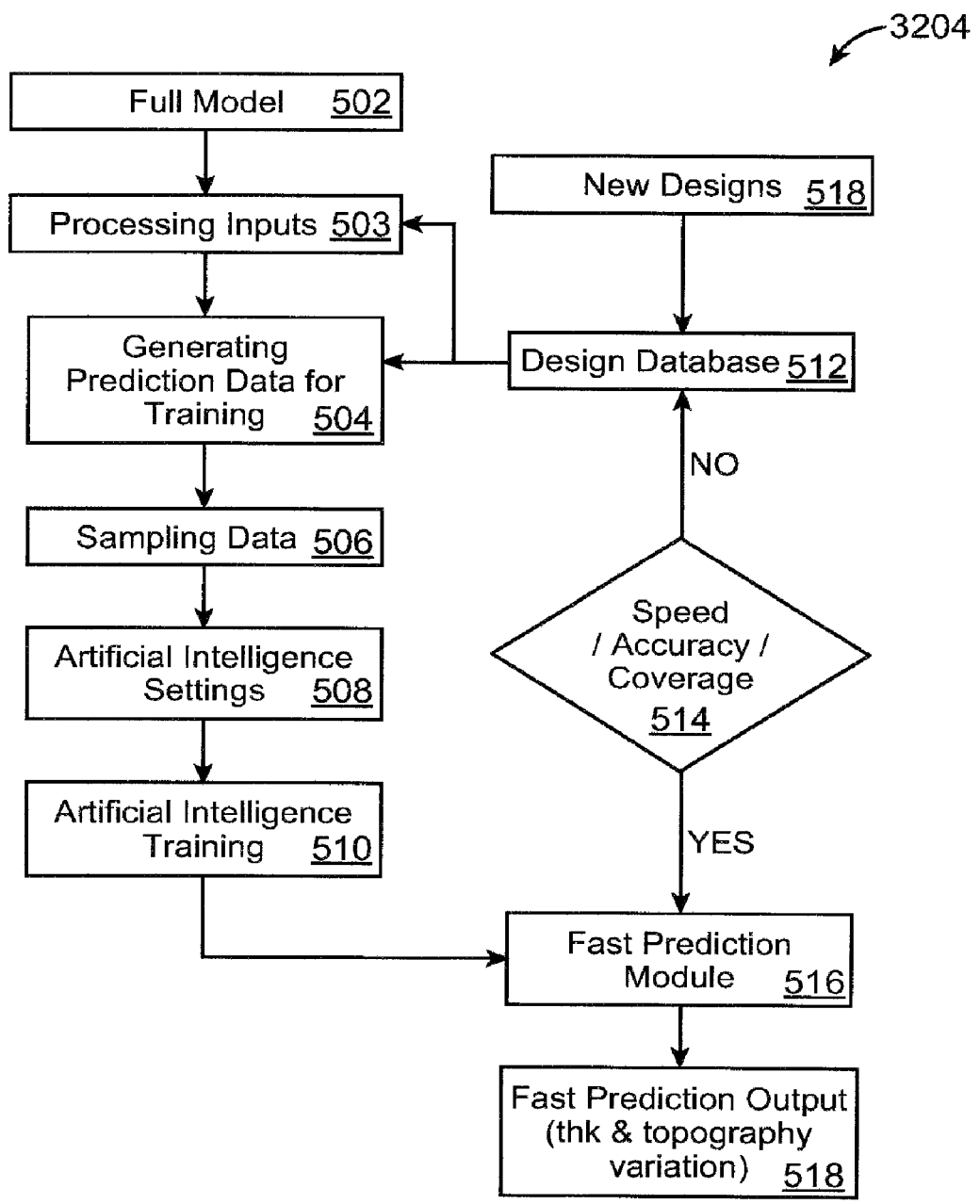
FIG. 5A illustrates more details about the just-right implementation module.

Referring to FIG. 5A which illustrates more details about the just-right implementation module at 3204. In some embodiments, the just-right implementation module is design independent and thus may be reused for different electronic circuit designs. In some embodiments, the just-right implementation is design dependent. In some embodiments, the just-right implementation module comprises one or more rule-based look-up tables. In some embodiments, the method or system for implementing a compact manufacturing model in the electronic circuit design flow determines the just-right implementation module by using regression analysis and represents the module in a polynomial representation. In some embodiments, the method or system for implementing a compact manufacturing model in the electronic circuit design flow implements the just-right implementing module by using artificial intelligence approach At 502, the method or system for implementing a compact manufacturing model in the electronic circuit design flow identifies a full model of the manufacturing process in some embodiments. In some embodiments, the method or system for implementing a compact manufacturing model in the electronic circuit design flow identifies the golden manufacturing process model at 502.

At 503, the method or system for implementing a compact manufacturing model in the electronic circuit design flow processes the inputs to reduce input dimensionality or cardinality in some embodiments. In some embodiments, the method or system for implementing a compact manufacturing model in the electronic circuit design flow uses the range of influence approach in reducing input dimensionality or cardinality. In these embodiments, the method or system for implementing a compact manufacturing model in the electronic circuit design flow defines a ring or range of influence within which some inputs may be combined.

In various embodiments, the method or system for implementing a compact manufacturing model in the electronic circuit design flow determines the range of influence theoretically, empirically, or experimentally when taking into account some parameters which govern the range of influence for a certain manufacturing process. For example, in some embodiments where the manufacturing process comprises a chemical mechanical polishing (CMP) process, the method or system for implementing a compact manufacturing model in the electronic circuit design flow may factor in theoretically, empirically, or experimentally the pad stiffness in determining the range of influence.

In some embodiments, the method or system for implementing a compact manufacturing model in the electronic circuit design flow combines all the inputs within the determined range and thus reduces the dimensionality or cardinality of the input. In some other embodiments, the method or system for implementing a compact manufacturing model in the electronic circuit design flow takes on the mean and deviation of a plurality of inputs within the determined range and thus reduce the dimensionality or cardinality of the input. In addition or in the alternative, the method or system for implementing a compact manufacturing model in the electronic circuit design flow may proceed to 503 to process inputs as a result of the introduction of the one or more new designs.

At 504, the method or system for implementing a compact manufacturing model in the electronic circuit design flow generates a set of prediction data for purposes which comprises training the system in terms of artificial intelligence in some embodiments. In some embodiments, the method or system for implementing a compact manufacturing model in the electronic circuit design flow employs statistical methods such as a stochastic method to ensure that a sufficient amount of data are generated for the intended purpose. In some embodiments, the method or system for implementing a compact manufacturing model in the electronic circuit design flow generates a set of prediction data according to the input (s), the ouput(s), and the one or more relationships/correlations between the input(s) and the output(s) of the physics-based data.

In some embodiments, the method or system for implementing a compact manufacturing model in the electronic circuit design flow generates a set of prediction data according to the input(s), the output(s), and the one or more relationships/correlations between the input(s) and the output(s) of the golden manufacturing process model for the corresponding manufacturing process. In some embodiments, the method or system for implementing a compact manufacturing model in the electronic circuit design flow uses an artificial neural network for generating the set of prediction data. In some other embodiments, the method or system for implementing a compact manufacturing model in the electronic circuit design flow uses one or more look-up tables for the input(s), output(s), and the one or more relationships/correlations to generate the set of prediction data.

At 506, the method or system for implementing a compact manufacturing model in the electronic circuit design flow samples the prediction data generated. At 508, the method or system for implementing a compact manufacturing model in the electronic circuit design flow identifies one or more artificial intelligence settings. In some embodiments, the method or system for implementing a compact manufacturing model in the electronic circuit design flow adopts neural network for the purpose of artificial intelligence.

In some embodiments, the neural network refers to the artificial neural network or a simulated neural network which is composed of structurally or functionally interconnecting artificial nodes or programming constructs using a mathematical and/or a computational model for information processing by mimicking one or more properties of biological neurons based upon a connectionistic approach to computation without actually constructing the actual model of the system under investigation. Note that various terms such as neurons, neurodes, processing elements, or units may be used interchangeably with the term "structurally or functionally interconnecting artificial nodes" or "programming constructs". In various embodiments, the artificial neural network comprises an adaptive system which changes its structure based upon external and/or internal information that goes through the artificial neural network.

At 510, the method or system for implementing a compact manufacturing model in the electronic circuit design now performs artificial intelligence training in some embodiments. In some embodiments, the method or system for implementing a compact manufacturing model in the electronic circuit design flow performs the training, on the artificial intelligence system or the artificial neural network to find, fine tune, adjust, or modify one or more relationships or correlations between the input(s) and output(s) of the compact manufacturing model.

In some embodiments, the compact manufacturing model comprises one or more functionals (i.e., one or more functions of function(s)) which describe the relationship(s) or correlation(s) between the input(s) and output(s) of the compact manufacturing model. In some embodiments, the compact manufacturing model comprises one or more tables or databases describing the relationship(s) or correlation(s) between the input(s) and the output(s) of the compact manufacturing model. In some embodiments, the compact manufacturing model comprises a combination of one or more functionals and one or more tables. In various embodiments, the method or system for implementing a compact manufacturing model in the electronic circuit design flow determines whether to implement the compact manufacturing model as one or more functionals, one or more tables/databases, or a combination of functionals and tables/databases based upon a result of a trade-off analysis for speed, accuracy, and convergence.

Once the training of the artificial intelligence approach is complete, the method or system for implementing a compact manufacturing model in the electronic circuit design flow may then invoke the fast prediction module 516 to predict the output(s) of the system based upon the corresponding input(s) of the model or system such as the compact manufacturing model at 518 in some embodiments where the method or system for implementing a compact manufacturing model in the electronic circuit design low finds a acceptable balance between speed and accuracy of the compact manufacturing model and coverage of the data at 514. In some embodiments where the method or system for implementing a compact manufacturing model in the electronic circuit design now cannot find a acceptable balance between the speed and accuracy of the compact manufacturing model and coverage of the data at 514, the method or system for implementing a compact manufacturing model in the electronic circuit design flow proceeds to add one or more new designs, 518, to the design database, 512, and forwards the data associated with the one or more new designs back to 504 to repeat the process as described above.

Figure 5B:
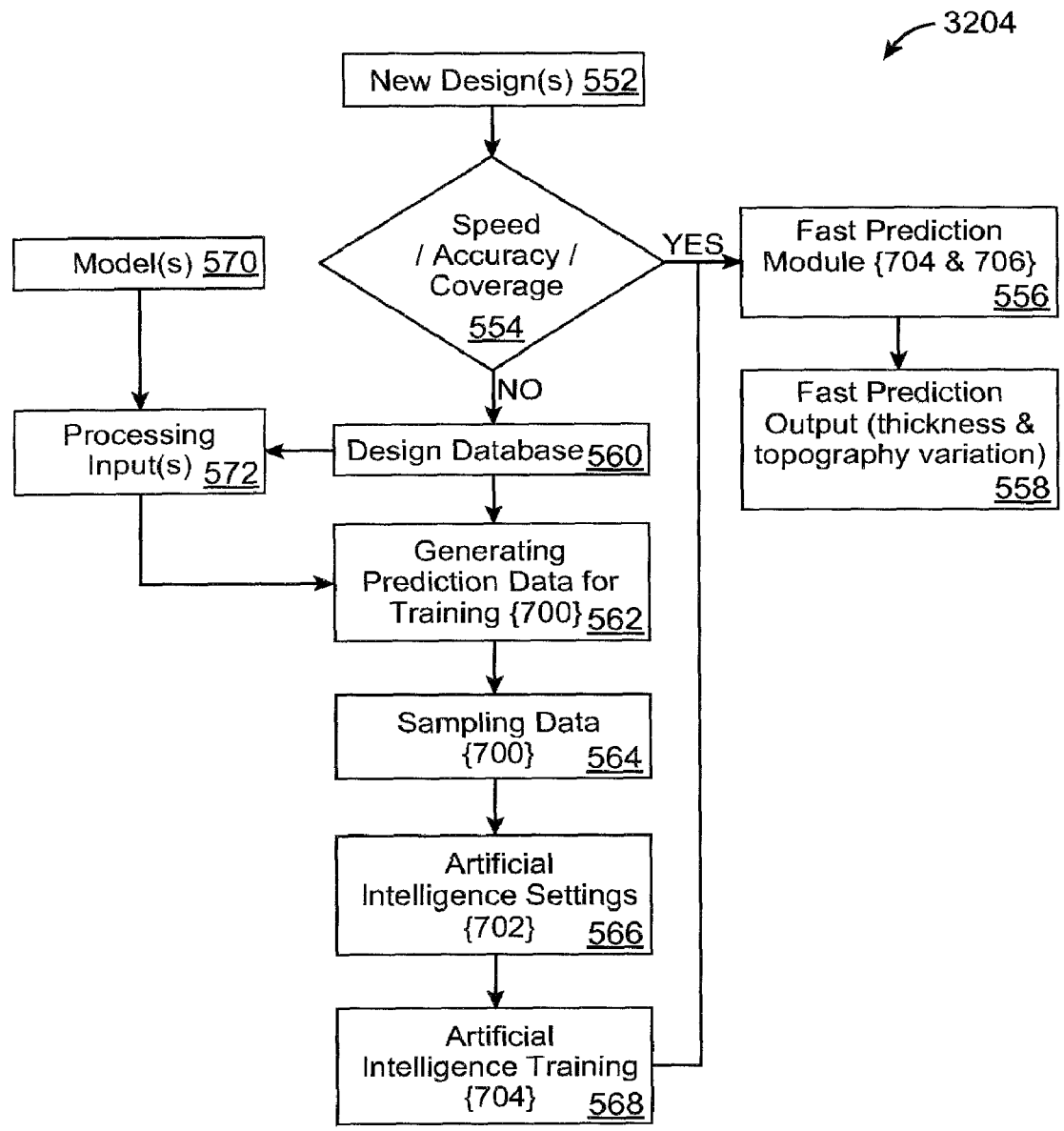
FIG. 5B illustrates more details about another just-right implementation module in some embodiments.

Referring to FIG. 5B which illustrates more details about another just-right implementation module 3204 in some embodiments. At 552, the method or system for implementing a compact manufacturing model in the electronic circuit design flow identifies one or more new designs of electronic circuit.

At 554, the method or system for implementing a compact manufacturing model in the electronic circuit design flow determines whether an acceptable balance between the speed and accuracy of the model may be found and whether the data provides sufficient coverage for the one or more new designs in some embodiments. In some embodiments whether the method or system for implementing a compact manufacturing model in the electronic circuit design flow finds an acceptable balance and coverage, the method or the system invokes the fast prediction module 556 and produces fast prediction output(s) in accordance with the input(s) at 558.

In some embodiments where the method or system for implementing a compact manufacturing model in the electronic circuit design flow cannot find an acceptable balance between the speed and the accuracy of the model or the coverage of the data, the method or system for implementing a compact manufacturing model in the electronic circuit design flow adds the one or more new designs to the design database at 560.

At 562, the method or system for implementing a compact manufacturing model in the electronic circuit design flow generates a set of prediction data for one or more purposes comprising training the system in terms of artificial intelligence in some embodiments. In some embodiments, the method or system for implementing a compact manufacturing model in the electronic circuit design flow employs statistical methods such as a stochastic method to ensure that a sufficient amount of data are generated for the intended purpose.

In some embodiments, the method or system for implementing a compact manufacturing model in the electronic circuit design flow generates a set of prediction data according to the input(s), the output(s), and the one or more relationships/correlations between the input(s) and the output(s) of the physics-based data. In some embodiments, the method or system for implementing a compact manufacturing model in the electronic circuit design flow generates a set of prediction data according to the input(s), the output(s), and the one or more relationships/correlations between the input(s) and the output(s) of the golden manufacturing process model for the corresponding manufacturing process.

In some embodiments, the method or system for implementing a compact manufacturing model in the electronic circuit design flow uses an artificial neural network for generating the set of prediction data. In some other embodiments, the method or system for implementing a compact manufacturing model in the electronic circuit design flow uses one or more look-up tables for the input(s), output(s), and the one or more relationships/correlations to generate the set of prediction data.

In addition or in the alternative, the method or system for implementing a compact manufacturing model in the electronic circuit design flow proceeds to process the inputs to reduce the dimensionality or cardinality of the inputs at 572 as a result of the introduction of the one or more new designs in some embodiments. In these embodiments, the method or system for implementing a compact manufacturing model in the electronic circuit design flow proceeds to generate a set of prediction data at 562 after processing the inputs at 572.

At 570, the method or system for implementing a compact manufacturing model in the electronic circuit design flow identifies a full model of the manufacturing process in some embodiments. In some embodiments, the method or system for implementing a compact manufacturing model in the electronic circuit design flow identifies the golden manufacturing process model at 570.

At 572, the method or system for implementing a compact manufacturing model in the electronic circuit design flow processes the inputs to reduce input dimensionality or cardinality in some embodiments. In some embodiments, the method or system for implementing a compact manufacturing model in the electronic circuit design flow uses the range of influence approach in reducing input dimensionality or cardinality. In these embodiments, the method or system for implementing a compact manufacturing model in the electronic circuit design flow defines a ring or range of influence within which some inputs may be combined.

In various embodiments, the method or system for implementing a compact manufacturing model in the electronic circuit design flow determines the range of influence theoretically, empirically, or experimentally when taking into account some parameters which govern the range of influence for a certain manufacturing process. For example, in some embodiments where the manufacturing process comprises a chemical mechanical polishing (CMP) process, the method or system for implementing a compact manufacturing model in the electronic circuit design flow may factor in theoretically, empirically, or experimentally the pad stiffness in determining the range of influence.

In some embodiments, the method or system for implementing a compact manufacturing model in the electronic circuit design flow combines all the inputs within the determined range and thus reduces the dimensionality or cardinality of the input. In some other embodiments, the method or system for implementing a compact manufacturing model in the electronic circuit design flow takes on the mean and deviation of a plurality of inputs within the determined range and thus reduce the dimensionality or cardinality of the input. In addition or in the alternative, the method or system for implementing a compact manufacturing model in the electronic circuit design flow may proceed to 572 to process inputs as a result of the introduction of the one or more new designs.

At 564, the method or system for implementing a compact manufacturing model in the electronic circuit design flow samples the prediction data generated. At 566, the method or system for implementing a compact manufacturing model in the electronic circuit design flow identifies one or more artificial intelligence settings. In some embodiments, the method or system for implementing a compact manufacturing model in the electronic circuit design flow adopts neural network for the purpose of artificial intelligence.

At 568, the method or system for implementing a compact manufacturing model in the electronic circuit design flow performs artificial intelligence training in some embodiments. In some embodiments, the method or system for implementing a compact manufacturing model in the electronic circuit design flow performs the training on the artificial intelligence system or the artificial neural network to find, fine tune, adjust, or modify one or more relationships or correlations between the input(s) and output(s) of the compact manufacturing model.

In some embodiments, the compact manufacturing model comprises one or more functionals (i.e., one or more functions of function(s)) which describe the relationship(s) or correlation(s) between the input(s) and output(s) of the compact manufacturing model. In some embodiments, the compact manufacturing model comprises one or more tables or databases describing the relationship(s) or correlation(s) between the input(s) and the output(s) of the compact manufacturing model.

In some embodiments, the compact manufacturing model comprises a combination of one or more functionals and one or more tables. In various embodiments, the method or system for implementing a compact manufacturing model in the electronic Once the training of the artificial intelligence approach is complete, the method or system for implementing a compact manufacturing model in the electronic circuit design flow may then invoke the fast prediction module 556 to predict the output(s) of the system based upon the corresponding input(s) of the model or system such as the compact manufacturing model at 558 in some embodiments.

Figure 6:
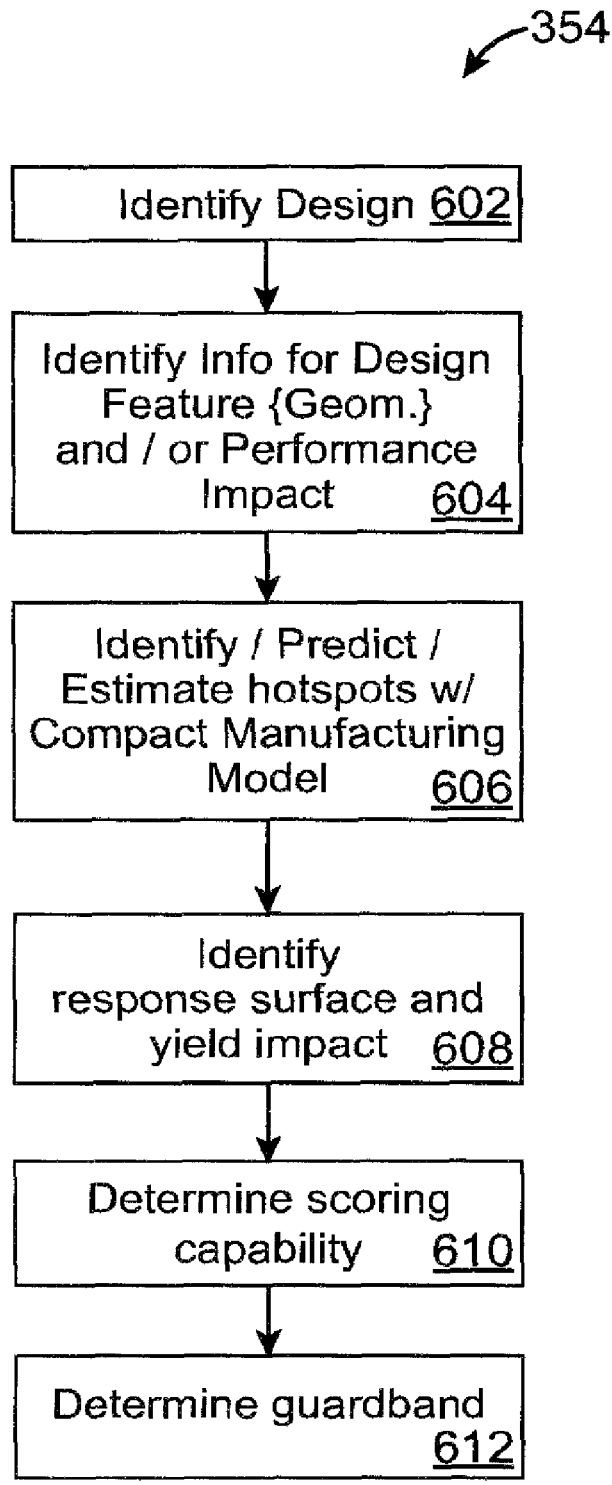
FIG. 6 illustrates more details about the correct-by-design decision module in some embodiments.

Referring to FIG. 6 which illustrates more details about the correct-by-design decision module 354 in some embodiments. At 602, the method or system for implementing a compact manufacturing model in the electronic circuit design flow identifies an electronic circuit design in some embodiments. At 604, the method or system for implementing a compact manufacturing model in the electronic circuit design flow identifies information for an input such as a design feature and/or an output Such as the performance impact on yield in some embodiments.

At 606, the method or system for implementing a compact manufacturing model in the electronic circuit design flow identifies, predicts, or estimates potential hotspots in the electronic circuit design using the compact manufacturing model. In some embodiments, the method or system for implementing a compact manufacturing model in the electronic circuit design now employs a model-based metal fill algorithm to fix potential hotspots identified. In various embodiments, hotspots represent areas in the electronic circuit design with high thick variation.

At 608, the method or system for implementing a compact manufacturing model in the electronic circuit design nohow identifies one or more response surfaces associated with the input such as the design feature and/or the output such as the performance impact on yield in some embodiments. For example, the method or system for implementing a compact manufacturing model in the electronic circuit design flow may identify the response surfaces which are associated with thickness variation of the dielectric layer and with the impact on yield in some embodiments. At 610, the method or system for implementing a compact manufacturing model in the electronic circuit design flow determines the scoring capability in some embodiments. At 612, the method or system for implementing a compact manufacturing model in the electronic circuit design flow determines a realistic guardband for each of the input based on the response surfaces identified at 608 in some embodiments.

Figure 7:
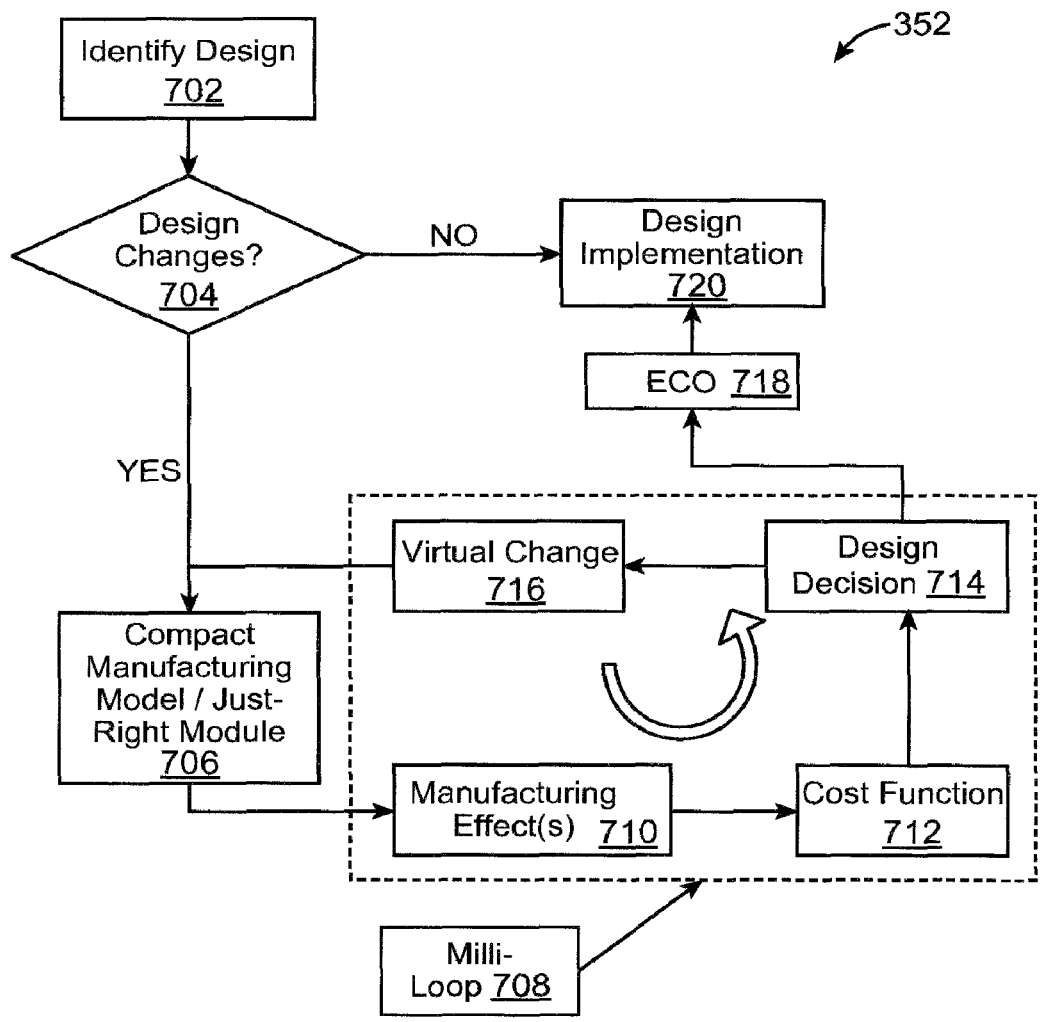
FIG. 7 illustrates more details of the correct-by-design correction module of the correct-by-design fast feedback module.

Referring to FIG. 7 which illustrates more details of the correct-by-design correction module 352 of the correct-by-design fast feedback module 308. At 702, the method or system for implementing a compact manufacturing model in the electronic circuit design flow receives or identifies an electronic circuit design in some embodiments. At 704, the method or system for implementing a compact manufacturing model in the electronic circuit design flow determines whether there are design changes to be implemented in some embodiments.

At 718 where the method or system for implementing a compact manufacturing model in the electronic circuit design flow determines that there are no design changes to be implemented, the method or system for implementing a compact manufacturing model in the electronic circuit design flow proceeds to 718 to implement the design in some embodiments. In some embodiments where the method or system for implementing a compact manufacturing model in the electronic circuit design flow determines there are design changes to implement, the method or system for implementing a compact manufacturing model in the electronic circuit design flow invokes the compact manufacturing model in some embodiments at 706.

At 708, the method or system for implementing a compact manufacturing model in the electronic circuit design flow iteratively invokes the milli-loop 708 to determine how to implement the design changes by using virtual changes in some embodiments. At 718 where milli-loop of the method or system for implementing a compact manufacturing model in the electronic circuit design flow determines how to implement the design changes, the method or the system issues the engineering change order (ECO) for the design changes at 718 in some embodiments. At 720, the method or system for implementing a compact manufacturing model in the electronic circuit design flow implements the engineering change order (ECO) in some embodiments.

In various embodiments, the milli-loop, 708, works with the compact manufacturing, model to perform and/or analyze virtual changes in response to the design changes identified by the method or system for implementing a compact manufacturing model in the electronic circuit design flow. The milli-loop 708 starts at 710 where the method or system for implementing a compact manufacturing model in the electronic circuit design flow receives or identifies one or more of the manufacturing effects of the corresponding manufacturing process in some embodiments.

At 712, the method or system for implementing a compact manufacturing model in the electronic circuit design flow identifies or determines one or more cost functions which are formulated or determined to be appropriate to evaluate the electronic circuit design with the design changes in some embodiments.

At 714, the milli-loop of the method or system for implementing a compact manufacturing model in the electronic circuit design flow determines whether the electronic circuit design with the input design changes satisfies the goals of the one or more cost functions in some embodiments. In some embodiments, the method or system for implementing a compact manufacturing model in the electronic circuit design flow determines whether the electronic circuit design with the design changes minimizes the one or more cost functions. In some other embodiments, the method or system for implementing a compact manufacturing model in the electronic circuit design flow determines whether the electronic circuit design with the design changes optimizes one or more objectives of the one or more cost functions.

In various embodiments where the method or system for implementing a compact manufacturing model in the electronic circuit design flow determines that one of the goals of the one or more cost functions is not met, the method or the system adjusts, modifies, or fine tunes the electronic circuit design by using one or more virtual changes at 716.

In various embodiments where the method or system for implementing a compact manufacturing model in the electronic circuit design flow generates one or more virtual changes, the method or the system evaluates or analyzes the one or more virtual changes by using the compact manufacturing model to determine how the design will react to the one or more virtual changes. For example, the method or system for implementing a compact manufacturing model in the electronic circuit design flow may generate a virtual change which is proposed to modify the electronic circuit design, then the method or the system may use different modules including the compact manufacturing model and the just-right module to analyze the proposed virtual change on, for example, a computer system before the method or the system finally implements the virtual change in the electronic circuit design in the form of, for example, an engineering change order.

Figure 8:
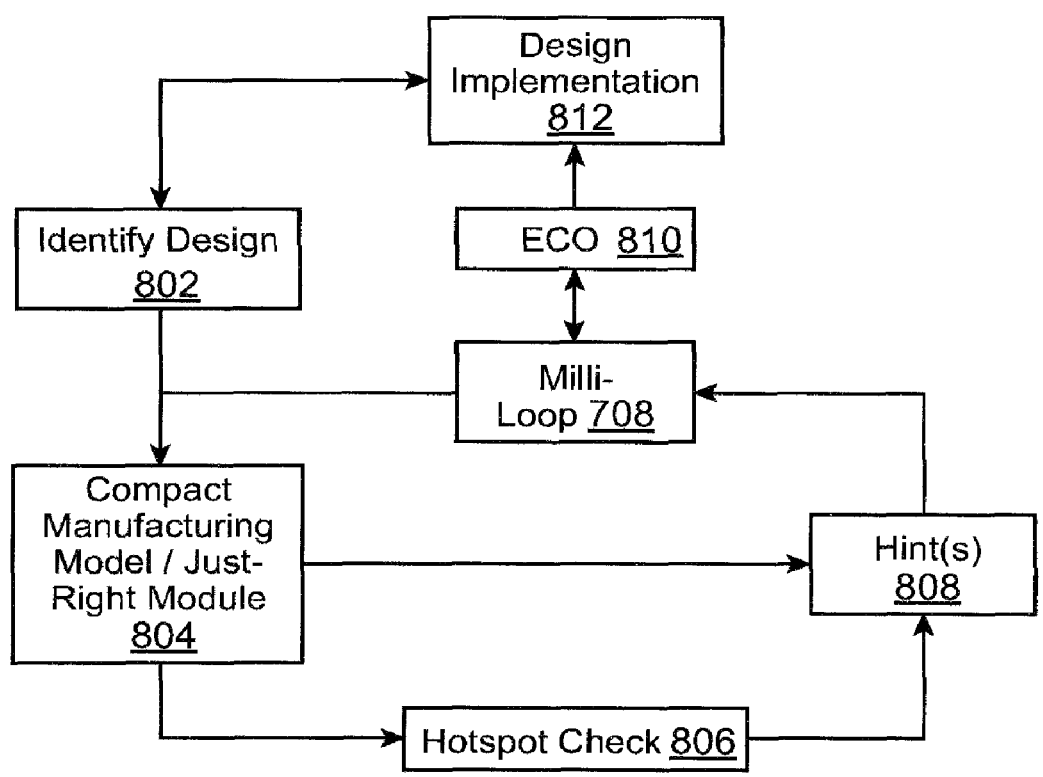
FIG. 8 illustrates more details of the application of the correct-by-design correction module in addition to or in the alternative of the correct-by-design correction module as shown in FIG. 7.

FIG. 8 illustrates more details of the application of the correct-by-design correction module in addition to or in the alternative of the correct-by-design correction module as shown in FIG. 7. In some embodiments, the method or system for implementing a compact manufacturing model in the electronic circuit design flow identifies or receives an electronic circuit design at 802.

In some embodiments where there are no design changes to be made in addition to the design identified, the method or system for implementing a compact manufacturing model in the electronic circuit design flow proceeds to 812 to implement the electronic circuit. In the alternative, the method or system for implementing a compact manufacturing model in the electronic circuit design flow may proceed to invoke the compact manufacturing model and/or the just-right module to perform various analyses or checks on the electronic circuit design in some embodiments at 804.

In some embodiments, the method or system for implementing a compact manufacturing model in the electronic circuit design flow may perform hotspot check to determine whether there are any hotspots related to the manufacturing effects in the electronic circuit design at 806. In some embodiments where there exist one or more hotspots in the electronic circuit design, the method or system for implementing a.

At 808, the method or system for implementing a compact manufacturing model in the electronic circuit design flow may generate one or more hints for adjusting fine tuning, or modifying the electronic circuit design in some embodiments. In some embodiments, at least one of the compact manufacturing model and the just-right module generates the hints after the at least one of the compact manufacturing model and the just-right module analyzes or evaluates the electronic circuit design.

In addition or in the alternative, the method or system for implementing a compact manufacturing model in the electronic circuit design flow generates the one or more hints for adjusting, fine timing, or modifying the electronic circuit in response to the hotspot check performed at 806 in some embodiments. In these embodiments where the method or system for implementing a compact manufacturing model in the electronic circuit design flow generates the one or more hints in response to the hotspot check, at least one of the one or more hints is directed at fixing the hotspots existing in the electronic circuit design.

At 708, the method or system for implementing a compact manufacturing model in the electronic circuit design flow invokes the milli-loop 708, which is described in great details above, to iteratively analyze or evaluate the one or more hints in the form of virtual chances. In some embodiments where the milli-loop determines that the one or more hints meet the requirement(s) of the milli-loop, the method or system for implementing a compact manufacturing model in tie electronic circuit design flow implements the one or more hints as one or more engineering change orders (ECOs) at 810.

In addition or in the alternative, the method or system for implementing a compact manufacturing model in the electronic circuit design flow may also forward the engineering change order at 810 into the milli-loop at 708 for evaluation or analyses to determine whether the engineering change orders may be implemented while satisfying various requirements, conditions, and/or goals of the electronic circuit design. At 812, the method or system for implementing a compact manufacturing model in the electronic circuit design flow implements the engineering change order(s) in some embodiments.

In some embodiments, the system or the process for implementing chemical mechanical polishing (CMP) simulation for an electronic circuit design further utilizes parallel computing or distributed computing to achieve the purpose(s).

System Architecture Overview

Figure 9:
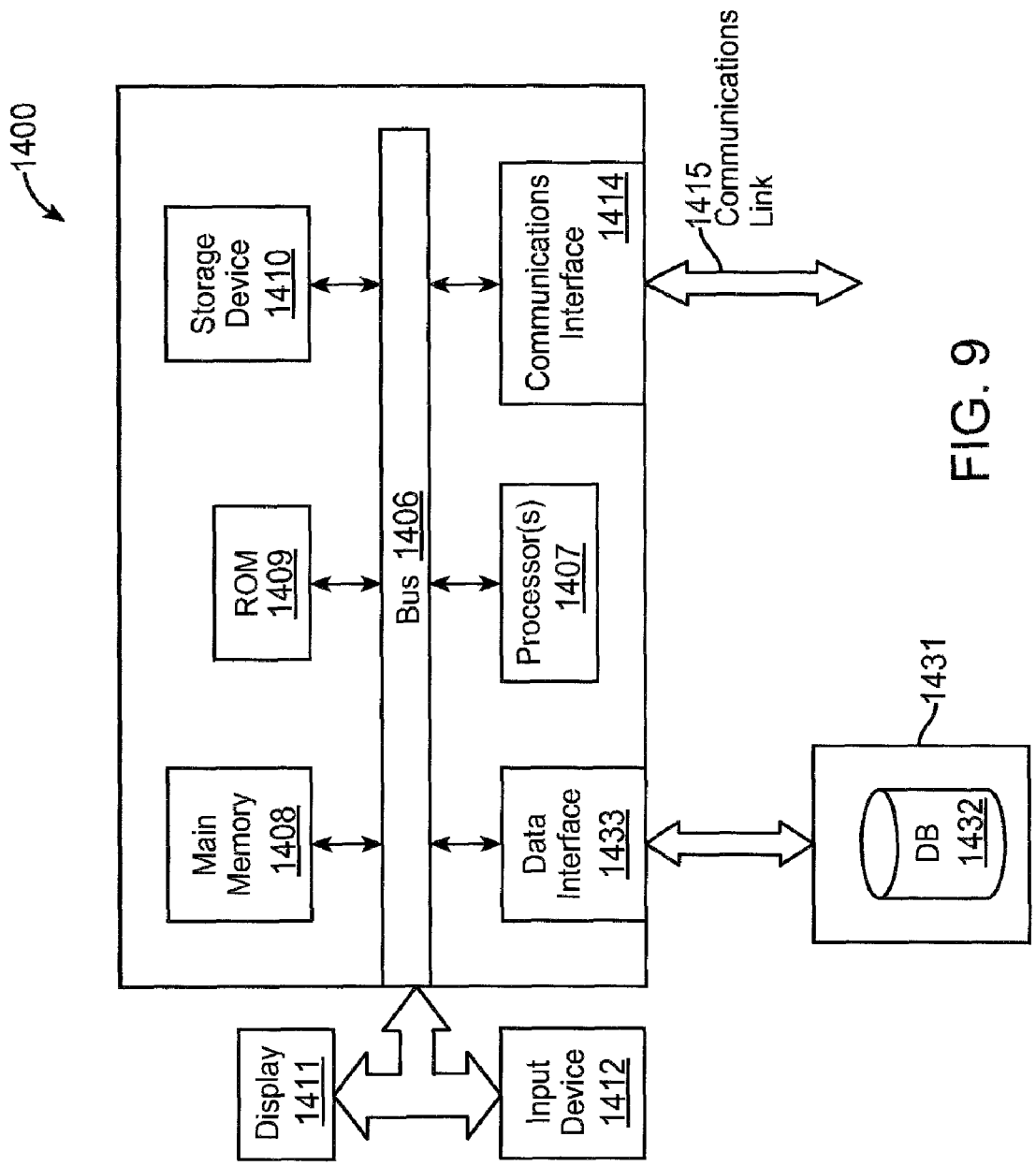
FIG. 9 illustrates a block diagram of an illustrative computing system suitable for implementing an embodiment of the present invention.

FIG. 9 illustrates a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by processor 1407 executing one or more sequences of one or more instruct ions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system I 1400). According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may also interact with a database system 1432 via a data interface 1433 where the computer system 1400 may store and retrieve information or data of the electronic design into and from the database system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A machine-implemented method for implementing a compact manufacturing model during various stages of an electronic circuit design, the method comprising:
    identifying the electronic circuit design;
    identifying a manufacturing process which is used to fabricate a portion of the electronic circuit design;
    identifying physics based data for the manufacturing process;
    determining or identifying the compact manufacturing model for the manufacturing process based at least in part upon the physics based data, wherein the compact manufacturing model correlates a first characteristic of the electronic circuit on a first physical domain to a second characteristic of the electronic circuit on a second performance domain; and
    displaying a result of the act of determining or identifying the compact manufacturing model or storing the result in a non-transitory computer-readable medium.

2. The machine-implemented method of claim 1, further comprising:
    identifying a design stage of the electronic circuit design; and
    determining a requirement for the design stage.

3. The machine-implemented method of claim 2, in which the act of determining the requirement for the design stage comprises:
    identifying at least one key contributor among a plurality of inputs for a specific goal;
    determining a correlation between the at least one key contributor and the specific goal; and
    determining the requirement for the design stage based at least upon the correlation.

4. The machine-implemented method of claim 3, in which the act of determining the correlation between the key contributor and the specific goal comprises:
    identifying a first metric on a first physical domain;
    identifying a second metric on a second performance domain; and
    establishing a correlation or relationship between the first physical domain and the second performance domain.

5. The machine-implemented method of claim 4, in which the act of determining the correlation between the key contributor and the specific goal further comprises:
    determining a bound for the first metric on the first physical domain based on the second metric on the second performance domain.

6. The machine-implemented method of claim 3, in which the act of identifying the at least one key contributor among the plurality of inputs for the specific goal comprises:
    identifying the plurality of inputs;
    identifying a correlation between a variation of one of the plurality of inputs and the specific goal; and
    identifying the at least one key contributor based at least in part upon the quantitative or qualitative correlation.

7. The machine-implemented method of claim 6, in which the correlation between the variation of the one of the plurality of inputs and the specific goal is quantitative or qualitative.

8. The machine-implemented method of claim 1, further comprising:
    identifying an input; and
    determining a prediction for the electronic circuit design for the input.

9. The machine-implemented method of claim 8, in which the act of determining the prediction for the electronic circuit design comprises:
determining a relationship between the a plurality of inputs and an output of the compact manufacturing model by using a set of training data.

10. The machine-implemented method of claim 9, in which the act of determining the prediction for the electronic circuit design further comprises:
identifying a first criterion; and
processing the first plurality of inputs.

11. The machine-implemented method of claim 10, in which the first criterion comprises a balance between speed of the compact manufacturing model and accuracy or a result of the compact manufacturing model.

12. The machine-implemented method of claim 10, in which the act of processing the first plurality of inputs comprises:
determining or identifying a range of influence; and
combining a plurality of inputs within the range of influence.

13. The machine-implemented method of claim 7, in which the act of determining the relationship between the first plurality of inputs and the output of the compact manufacturing model by using a set of training data is performed using an artificial neural network.

14. The machine-implemented method of claim 1, further comprising:
identifying a potential problem area in the electronic circuit design using the compact manufacturing model.

15. The machine-implemented method of claim 11, in which the potential problem are comprises a hotspot.

16. The machine-implemented method of claim 1, further comprising:
determining a guard-band for an input using the compact manufacturing model.

17. The machine-implemented method of claim 1, further comprising:
implementing the virtual change as an engineering change order.

18. The machine-implemented method of claim 17, further comprising:
determining whether the virtual change meets a goal of the electronic circuit design.

19. The machine-implemented method of claim 18, further comprising:
generating a hint using the compact manufacturing model; and
implementing the hint as a virtual change.

20. The machine-implemented method of claim 13, in which the act of generating a hint using the compact manufacturing model is performed in response to a design change identified.

21. The machine-implemented method of claim 1, wherein the design stage comprises floor planning, placement, routing, or post-routing optimization.

22. A system for implementing a compact manufacturing model during various stages of an electronic circuit design, the system comprising:
a processor; and
memory to hold programmable instructions for:
identifying the electronic circuit design;
identifying a manufacturing process which is used to fabricate a portion of the electronic circuit design;
identifying physics based data for the manufacturing process;
determining or identifying the compact manufacturing model for the manufacturing process based at least in part upon the physics based data, wherein the compact manufacturing model correlates a first characteristic of the electronic circuit on a first physical domain to a second characteristic of the electronic circuit on a second performance domain; and
displaying a result of the act of determining or identifying the compact manufacturing model or storing the result in a computer readable medium.

23. A computer program product comprising a non-transitory computer-usable storage medium having executable code to execute a process for implementing a compact manufacturing model during various stages of an electronic circuit design, the process comprising:
identifying the electronic circuit design;
identifying a manufacturing process which is used to fabricate a portion of the electronic circuit design;
identifying physics based data for the manufacturing process;
determining or identifying the compact manufacturing model for the manufacturing process based at least in part upon the physics based data, wherein the compact manufacturing model correlates a first characteristic of the electronic circuit on a first physical domain to a second characteristic of the electronic circuit on a second performance domain; and
displaying a result of the act or determining or identifying the compact manufacturing model or storing the result in a computer readable medium.

24. The system of claim 22, wherein the programmable instructions further include instructions for:
identifying a design stage of the electronic circuit design; and
determining a requirement for the design stage.

25. The system of claim 24, in which the instructions for determining the requirement for the design stage include instructions for:
identifying at least one key contributor among a plurality of inputs for a specific goal;
determining a correlation between the at least one key contributor and the specific goal; and
determining the requirement for the design stage based at least upon the correlation.

26. The system of claim 25, in which the instructions for determining the correlation between the key contributor and the specific goal include instructions for:
identifying a first metric on a first physical domain;
identifying a second metric on a second performance domain; and
establishing a correlation or relationship between the first physical domain and the second performance domain.

27. The system of claim 25, in which the instructions for determining the correlation between the key contributor and the specific goal further include instructions for:
determining a bound for the first metric on the first physical domain based on the second metric on the second performance domain.

28. The system of claim 25, in which the instructions for identifying the at least one key contributor among the plurality of inputs for the specific goal include instructions for:
identifying the plurality of inputs;
identifying a correlation between a variation of one of the plurality of inputs and the specific goal; and
identifying the at least one key contributor based at least in part upon the quantitative or qualitative correlation.

29. The system of claim 28, in which the correlation between the variation of the one of the plurality of inputs and the specific goal is quantitative or qualitative.

30. The system of claim 22, wherein the programmable instructions further include instructions for:
   identifying an input; and
   determining a prediction for the electronic circuit design for the input.

31. The system of claim 30, in which the instructions for determining the prediction for the electronic circuit design include instructions for:
   determining a relationship between the a plurality of inputs and an output of the compact manufacturing model by using a set of training data.

32. The computer program product of claim 23, wherein the process further comprises:
   identifying a design stage of the electronic circuit design; and
   determining a requirement for the design stage.

33. The computer program product of claim 32, in which the determining the requirement for the design stage comprises:
   identifying at least one key contributor among a plurality of inputs for a specific goal;
   determining a correlation between the at least one key contributor and the specific goal; and
   determining the requirement for the design stage based at least upon the correlation.

34. The computer program product of claim 33, in which the determining the correlation between the key contributor and the specific goal comprises:
   identifying a first metric on a first physical domain;
   identifying a second metric on a second performance domain; and
   establishing a correlation or relationship between the first physical domain and the second performance domain.

35. The computer program product of claim 33, in which the determining the correlation between the key contributor and the specific goal further comprises:
   determining a bound for the first metric on the first physical domain based on the second metric on the second performance domain.

36. The computer program product of claim 33, in which the identifying the at least one key contributor among the plurality of inputs for the specific goal comprises:
   identifying the plurality of inputs;
   identifying a correlation between a variation of one of the plurality of inputs and the specific goal; and
   identifying the at least one key contributor based at least in part upon the quantitative or qualitative correlation.

37. The computer program product of claim 36, in which the correlation between the variation of the one of the plurality of inputs and the specific goal is quantitative or qualitative.

38. The computer program product of claim 23, wherein the process further comprises:
   identifying an input; and
   determining a prediction for the electronic circuit design for the input.

39. The computer program product of claim 38, in which the determining the prediction for the electronic circuit design comprises:
   determining a relationship between the a plurality of inputs and an output of the compact manufacturing model by using a set of training data.

* * * * *